(12) United States Patent
Wiesinger et al.

(10) Patent No.: US 11,275,142 B1
(45) Date of Patent: Mar. 15, 2022

(54) SYSTEM AND METHOD FOR PERFORMING MOTION-INSENSITIVE AND QUIET THREE-DIMENSIONAL MAGNETIC RESONANCE IMAGING

(71) Applicants: GE PRECISION HEALTHCARE LLC, Wauwatosa, WI (US); KING'S COLLEGE LONDON, London (GB)

(72) Inventors: Florian Wiesinger, Freising (DE); Ana Beatriz Solana Sanchez, Munich (DE); Anne Menini, Sunnyvale, CA (US); Emil Albert Ljungberg, London (GB); Tobias Charles Wood, Kilburn (GB); Gareth John Barker, London (GB); Steven Charles Williams, Twickenham (GB)

(73) Assignees: GE PRECISION HEALTHCARE LLC, Wauwatosa, WI (US); KING'S COLLEGE LONDON, London (GB)

( * ) Notice: Subject to any disclaimer, the term of this patent is extended or adjusted under 35 U.S.C. 154(b) by 7 days.

(21) Appl. No.: 17/090,557

(22) Filed: Nov. 5, 2020

(51) Int. Cl.
*G01R 33/565* (2006.01)
*G01R 33/56* (2006.01)
(Continued)

(52) U.S. Cl.
CPC ... *G01R 33/56509* (2013.01); *G01R 33/4826* (2013.01); *G01R 33/5607* (2013.01);
(Continued)

(58) Field of Classification Search
USPC .......................................................... 324/309
See application file for complete search history.

(56) References Cited

U.S. PATENT DOCUMENTS

| | | | | |
|---|---|---|---|---|
| 8,934,691 | B2 * | 1/2015 | Sheltraw | G01R 33/56509 382/131 |
| 2008/0054899 | A1 * | 3/2008 | Aksoy | G01R 33/5611 324/307 |
| 2018/0210058 | A1 * | 7/2018 | De Weerdt | G01R 33/5611 |

OTHER PUBLICATIONS

Wong, Sam T. S. et al.; "A Strategy for Sampling on a Sphere Applied to 3D Selective RF Pulse Design", MRM, vol. 32, pp. 778-784 (1994), Williams & Wilkins.

(Continued)

*Primary Examiner* — Rodney E Fuller
(74) *Attorney, Agent, or Firm* — Fletcher Yoder, P.C.

(57) ABSTRACT

A method for generating motion-corrected medical images includes obtaining, via a processor, k-space data of a region of interest acquired by a magnetic resonance imaging system utilizing a 3D radial pulse sequence with ZTE acquisition including optional magnetization preparation pulses. The method also includes sampling, via the processor, the k-space data to obtain a plurality of interleaved k-space segments. The method further includes reconstructing, via the processor, one or more interleaved k-space segments of the plurality of interleaved k-space segments to generate a respective motion navigator volume. The method even further includes co-registering, via the processor, each respective motion navigator volume to estimate motion and performing motion correction on the one or more interleaved k-space segments and their corresponding k-space trajectories. The method still further includes generating, via the processor, a motion-corrected volume from all of the motion corrected interleaved k-space segments and their corresponding motion corrected k-space trajectories.

20 Claims, 6 Drawing Sheets

(51) Int. Cl.
*G01R 33/567* (2006.01)
*G06T 11/00* (2006.01)
*G01R 33/48* (2006.01)

(52) U.S. Cl.
CPC ..... *G01R 33/5608* (2013.01); *G01R 33/5676* (2013.01); *G06T 11/008* (2013.01); *G06T 2210/41* (2013.01)

(56) References Cited

OTHER PUBLICATIONS

Madio, David P. et al.; "Ultra-Fast Imaging Using Low Flip Angles and FIDs", MRM, vol. 34, pp. 525-529 (1995), Williams & Wilkins.

Rasche, Volker et al.; "Continuous Radial Data Acquisition for Dynamic MRI", MRM, vol. 34, pp. 754-761 (1995), Williams & Wilkins.

Pipe, James G.; "Motion Correction With Propeller MRI: Application to Head Motion and Free-Breathing Cardiac Imaging", Magnetic Resonance In Medicine, vol. 42, pp. 963-969 (1999), Wiley-Liss, Inc.

Welch, Edward Brian et al.; "Spherical Navigator Echoes for Full 3D Rigid Body Motion Measurement in MRI", Magnetic Resonance in Medicine, vol. 47, pp. 32-41 (2002), Wiley-Liss, Inc.

Swinbank, Richard et al.; "Fibonacci grids: A novel approach to global modelling", Quarterly Journal of the Royal Meteorological Society, vol. 132 pp. 1769-1793 (2006), Crown.

Larson, Peder E. Z. et al.; "Anisotropic Field-of-Views in Radial Imaging", IEEE Transactions on Medical Imaging, vol. 27, pp. 47-57 (2008), IEEE.

Piccini, Davide et al.; "Spiral Phyllotaxis: The Natural Way to Construct a 3D Radial Trajectory in MRI", Magnetic Resonance in Medicine, vol. 66, pp. 1049-1056 (2011), Wiley-Liss, Inc.

Vaillant, Ghislain et al.; "Retrospective Rigid Motion Correction in k-Space for Segmented Radial MRI", IEEE Transactions on Medical Imaging, vol. 33, pp. 1-10 (2014), IEEE.

Wiesinger, Florian et al.; "Zero TE MR Bone Imaging in the Head", Magnetic Resonance in Medicine, vol. 75, pp. 107-114 (2016), Wiley-Liss, Inc.

Kecskemeti, Steven et al.; "Robust Motion Correction Strategy for Structural MRI in Unsedated Children Demonstrated with Three-dimensional Radial MPnRAGE", Radiology, vol. 289, pp. 509-516 (2018), RSNA.

Niesinger, Florian et al.; "Looping Star", Magnetic Resonance in Medicine, vol. 81, pp. 57-68 (2019), https://doi.org/10.1002/mrm.27440.

Corum, Curtis A et al.; "HEALPix View-order for 3D Radial Self-Navigated Motion-Corrected Zte Mri", arXiv preprint arXiv:1910.10276 (2019), https://arxiv.org/ftp/arxiv/papers/1910/1910.10276.pdf.

Boucneau, Tanguy et al.; "AZTEK: Adaptive zero TE k-space trajectories", Magnetic Resonance in Medicine, vol. DO, pp. 1-10 (2020), https://doi.org/10.1002/mrm.28483.

KECSKEME 11, STEVEN et al.; "Three-dimensional motion-corrected T1 relaxometry with MPnRAGE", Magnetic Resonance in Medicine, vol. 84, pp. 2400-2411 (2020), https://doi.org/10.1002/mrm.28283.

Krishnamoorthy, Guruprasad et al.; "Variable anisotropic FOV for 3D radial imaging with spiral phyllotaxis VASP)", Magnetic Resonance in Medicine, vol. 00, pp. 1-10 (2020), https://doi.org/10.1002/mrm.28449.

Lee, Hyunyeol et al.; "Self-Navigated Three-Dimensional Ultra-short Echo Time Technique for Motion-Corrected Skull Mri", IEEE Transactions on Medical Imaging, Doi 10.1109/TMI.2020.2978405 (2020), IEEE.

Usman, Muhammad et al.; "Retrospective Motion Correction in Multishot MRI using Generative Adversarial Network", Scientific Reports, vol. 10,4786 (2020), https://doi.org/10.1038/s41598-020-61705-9.

* cited by examiner

SYSTEM AND METHOD FOR PERFORMING MOTION-INSENSITIVE AND QUIET THREE-DIMENSIONAL MAGNETIC RESONANCE IMAGING

TECHNICAL FIELD

The subject matter disclosed herein relates to medical imaging, and more particularly to systems and methods for performing motion-insensitive and quiet three-dimensional magnetic resonance imaging.

BACKGROUND

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

However, imaging technologies such as magnetic resonance imaging (MRI) are subject to fundamental problems such as patient motion and loud acoustic noise that may adversely affect image quality and patient comfort. These problems may be amplified with very unwell patients or the least compliant patients. Therefore, there is a need for acquisition and reconstruction techniques that may provide improved benefits by minimizing redundancy in data collection, improving patient comfort during a scan, and recovering data that otherwise would be lost due to motion.

MRI scanners may produce loud acoustic noise due to Lorentz forces in the magnetic field gradient coils from the rapidly changing currents typically required for data acquisition. The acoustic noise may adversely affect patient comfort and in very unwell patients, make scanning impossible.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In a first embodiment, a method for generating motion-corrected medical images is provided. The method includes obtaining, via a processor, k-space data of a region of interest acquired by a magnetic resonance imaging system utilizing a three-dimensional (3D) radial pulse sequence with zero echo time (ZTE) acquisition including optional magnetization preparation pulses. The method also includes sampling, via the processor, the k-space data to obtain a plurality of interleaved k-space segments. The method further includes reconstructing, via the processor, one or more interleaved k-space segments of the plurality of k-space segments to generate a respective motion navigator volume. The method even further includes co-registering, via the processor, each respective motion navigator volume to estimate motion and performing motion correction on the one or more interleaved k-space segments and their corresponding k-space trajectories. The method still further includes generating, via the processor, a motion-corrected volume from all of the motion corrected interleaved k-space segments and their corresponding motion corrected k-space trajectories.

In a further embodiment, a medical image motion correction system is provided. The system includes processing circuitry configured to execute one or more stored routines, wherein the routines, when executed, cause the processing circuitry to: obtain, via a processor, k-space data of a region of interest acquired by a magnetic resonance imaging system utilizing a three-dimensional (3D) radial pulse sequence with zero echo time acquisition including optional magnetization preparation pulses; sample the k-space data utilizing an interleaved 3D radial sampling pattern to obtain a plurality of interleaved segments; reconstruct one or more interleaved k-space segments of the plurality of k-space segments to generate a respective motion navigator volume; co-register each respective motion navigator volume to estimate motion; perform motion correction on each interleaved k-space segment and their corresponding k-space trajectories; and generate a motion-corrected volume from all of the motion corrected interleaved k-space segments and their corresponding motion corrected k-space trajectories.

In an additional embodiment, a non-transitory computer-readable medium is provided. The computer-readable medium includes processor-executable code that when executed by a processor, causes the processor to: obtain, via a processor, k-space data of a region of interest acquired by a magnetic resonance imaging system utilizing a three-dimensional (3D) radial pulse sequence with zero echo time acquisition; sample the k-space data utilizing an interleaved 3D radial sampling pattern to obtain a plurality of interleaved k-space segments; reconstruct each interleaved k-space segment of the plurality of segments to generate a respective motion navigator volume; co-register each respective motion navigator volume to estimate motion; perform motion correction on one or more interleaved k-space segments and their corresponding k-space trajectories; and generate a motion-corrected volume from all of the motion corrected interleaved k-space segments and their corresponding motion corrected k-space trajectories.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
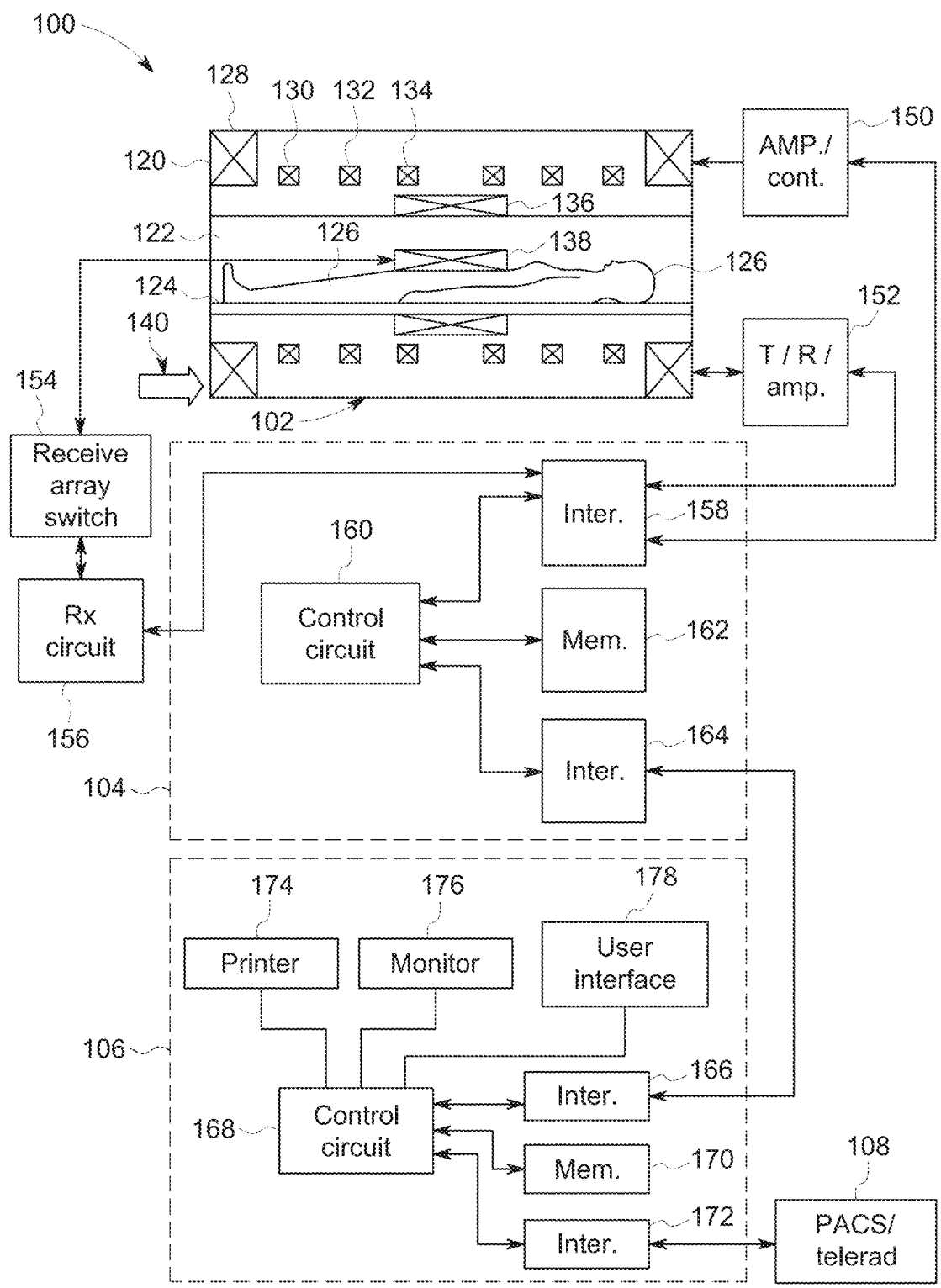
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

The presently contemplated embodiments provide for a system and a method that enable three-dimensional (3D) motion insensitive and quiet magnetic resonance imaging (MM). For example, processing circuitry may be configured for generating motion-corrected medical images by obtaining k-space data of a region of interest (e.g., brain or other region of the body) acquired by a MRI system utilizing a three-dimensional (3D) radial pulse sequence with zero echo time (ZTE) (e.g., the rotating ultra-fast imaging sequence (RUFIS), Point-wise encoding time reduction with radial acquisition (PETRA), gradient-modulated ZTE, Water- and fat-suppressed proton projection MRI (WASPI), or Hybrid filling of the dead-time gap (HYFI)). The ZTE pulse sequence may include interleaved magnetization preparation pulses such as T1 preparation, T2 preparation, Magnetization Transfer (MT) preparation, Arterial Spin Labeling (ASL) preparation, Diffusion preparation, or a combination thereof to encode additional contrasts beyond the native Proton Density (PD) and T1 relaxation weighting provided by ZTE without magnetization preparation. The processing circuitry may also be configured for sampling the k-space data to obtain a plurality of interleaved segments using an interleaved trajectory with smooth changes in gradient amplitude to allow for quiet operation (e.g., an interleaved 3D radial sampling pattern such as a phyllotaxis-type or adaptive ZTE k-space (AZTEK)-type trajectories). For example, the level of acoustic noise may be reduced by reducing the rate of gradient switching. This may be realised using pulse sequences with zero echo time (ZTE) where spin excitation is performed with a radio frequency pulse with the magnetic field gradients already ramped up. If the gradient amplitude is gradually stepped directly to the next excitation, the acoustic noise may be very limited. The processing circuitry may also be configured for reconstructing one or more interleaved k-space segments of the plurality of segments to generate a respective motion navigator volume (e.g., intrinsic motion navigator volume). In certain embodiments, certain interleaved k-space segments may not have a reliable motion navigator volume generated due to extreme motion conditions which might then be excluded from the overall acquired dataset. For example, certain segments cannot be registered to a reference state due to highly non-rigid motion components. The processing circuitry may also be configured for co-registering each respective motion navigator volume to estimate motion and performing motion correction (e.g. for both intra-scan and inter-scan motion) on the plurality of interleaved k-space segments and corresponding sampling trajectories. The processing circuitry may also be configured for generating, via the processor, a motion-corrected volume from all or a subset of the motion corrected k-space data and the motion-corrected interleaved k-space trajectory segments. This technique may minimize redundancy in data collection. In addition, this technique may improve patient comfort during a scan and recover data that otherwise may be lost due to motion, which may reduce costs (e.g., by reducing the number of scans needed). The ability to perform inter-scan motion correction may allow for a break during a long scan (e.g. visiting the bathroom) or follow-up examination later point. Further, the technique may enable those patients that are in the greatest need of assessment (e.g., those that are very unwell or the least compliant) to be scanned by improving comfort with the quiet acquisition and avoiding prolonging the scan time to re-acquire motion-corrupted data.

With the preceding in mind, FIG. 1 a magnetic resonance imaging (MM) system 100 is illustrated schematically as including a scanner 102, scanner control circuitry 104, and system control circuitry 106. According to the embodiments described herein, the Mill system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 to be positioned therein for imaging selected anatomy within the patient.

Scanner 102 includes a series of associated coils for producing controlled magnetic fields for exciting the gyromagnetic material within the anatomy of the subject being imaged. Specifically, a primary magnet coil 128 is provided for generating a primary magnetic field, BO, which is generally aligned with the bore 122. A series of gradient coils 130, 132, and 134 permit controlled magnetic gradient fields to be generated for positional encoding of certain of the gyromagnetic nuclei within the patient 126 during examination sequences. A radio frequency (RF) coil 136 is configured to generate radio frequency pulses for exciting the certain gyromagnetic nuclei within the patient. In addition to the coils that may be local to the scanner 102, the system 100 also includes a set of receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain of the gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, Bo. A power input 44 (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuit 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuit 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuit 104 and system control circuit 106. In certain embodiments, the control and analysis circuit 160, while illustrated as a single unit, may include one or more hardware devices. The system control circuit 106 includes an interface circuit 166, which receives data from the scanner control circuit 104 and transmits data and commands back to the scanner control circuit 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
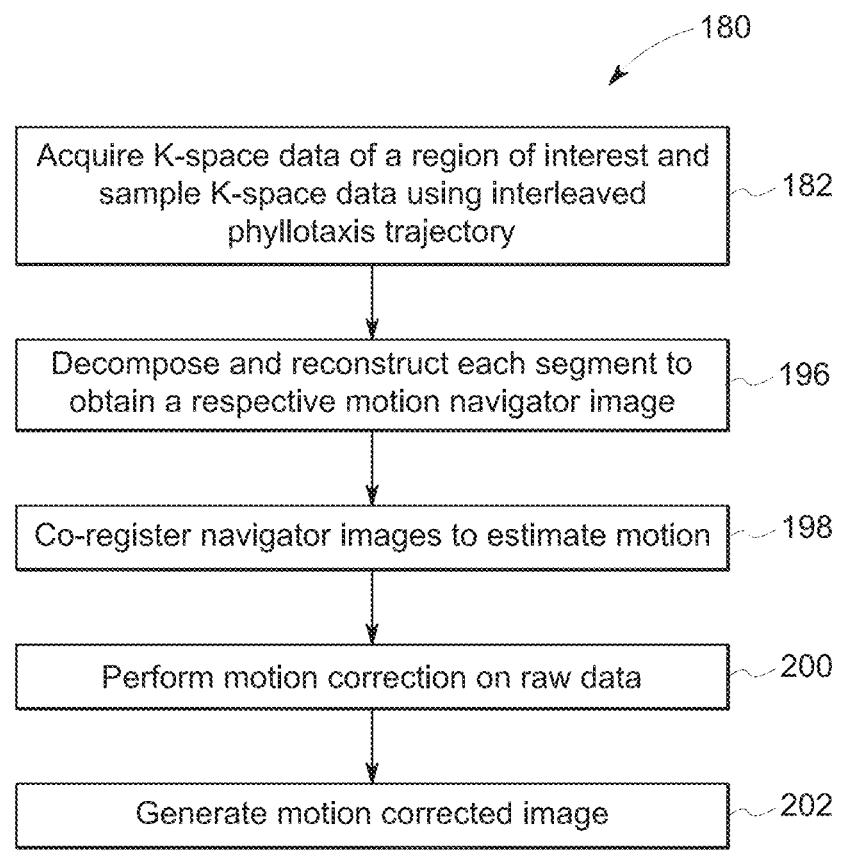
FIG. 2 is a flow chart of an embodiment of a method for correcting motion in a medical image, in accordance with aspects of the present disclosure.
Figure 3:
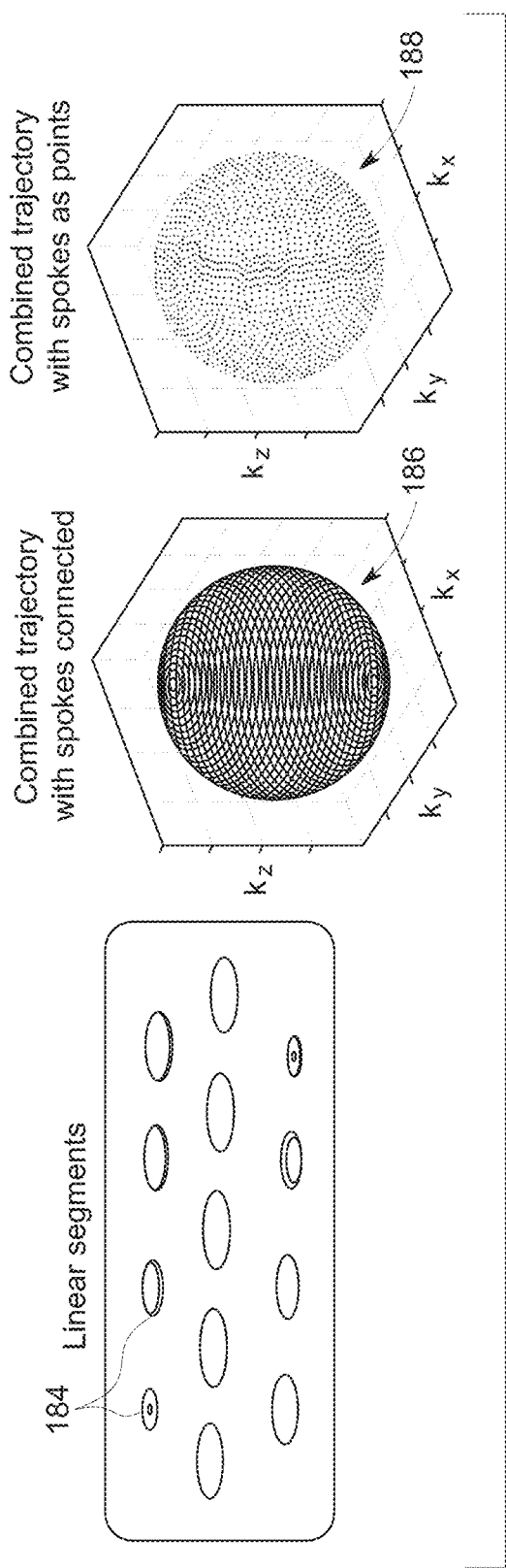
FIG. 3 illustrates an embodiment of segments and their combined trajectories using standard k-space trajectories (e.g., with spokes connected and spokes as points)

FIG. 2 is a flow chart of an embodiment of a method 180 for correcting motion in a medical image. One or more of the steps of the method 180 may be performed by one or more components of the MM system 100 (e.g., control and analysis circuit 160, control and analysis circuit 168) and/or on- or off-site processing circuitry. In addition, the method 180 may be utilized with quantitative MM. Furthermore, the technique may also be used to track motion in a hybrid positron emission tomography (PET) and MRI systems, or hybrid linear accelerator (linac) and MRI systems. The method 180 includes acquiring or obtaining k-space data of a region of interest (e.g., brain or other region of the body) acquired via a 3D radial pulse sequence by the MM system 100 (block 182) enabling quiet imaging while sampling the k-space data to obtain a plurality of interleaved k-space segments. For example, the 3D radial pulse sequence utilized to acquire the k-space data may be a zero echo time (ZTE) pulse sequence, such as the rotating ultra-fast imaging sequence (RUFIS), or derivatives thereof. Other types of 3D radial pulse sequences that may be utilized include point-wise encoding time reduction with radial acquisition (PETRA), gradient-modulated ZTE, water- and fat-suppressed proton projection MM (WASPI) and hybrid filling of the dead-time gap (HYFI). In ZTE imaging, the image encoding starts immediately at full speed at the time of spin excitation (e.g., leading to a nominal TE of zero) due to readout gradients not being ramped down between repetitions. ZTE utilizes free-induction decay (FID) responses generated by an ultra-short RF pulse, achieving an effective echo time of zero. More specifically, ZTE encodes the FIDs along different angular orientations in k-space. Thus, each FID corresponds to a single readout, which may be a radial line in k-space along the gradient's direction, or it may be a curve described by a gradient waveform originating from the center of k-space. A ZTE pulse sequence includes a plurality of FIDs. More specifically, a ZTE pulse sequence may be divided into a plurality of segments wherein each of the segments includes at least one FID. Furthermore each ZTE segment may include magnetization preparation pulses such as T1 preparation, T2 preparation, Magnetization Transfer (MT) preparation, Arterial Spin Labeling (ASL) preparation, Diffusion preparation, or a combination thereof to encode additional contrasts beyond the native Proton Density (PD) and T1 relaxation weighting provided by ZTE without magnetization preparation. In operation, a ZTE pulse sequence performs a radial center-outer data acquisition pattern as depicted in FIG. 3 illustrating a standard ZTE trajectory consisting of a single pass through k-space (without an interleaved trajectory). As depicted, the acquired segments consist of segments 184 or spokes acquired linearly along kz. In FIG. 3, a combined trajectory 186 of the linear segments 184 is illustrated with each spoke connected by a line in the order they were acquired. A combined trajectory 188 of the linear segments with each spoke shown as a dot is also illustrated.

Figure 4:
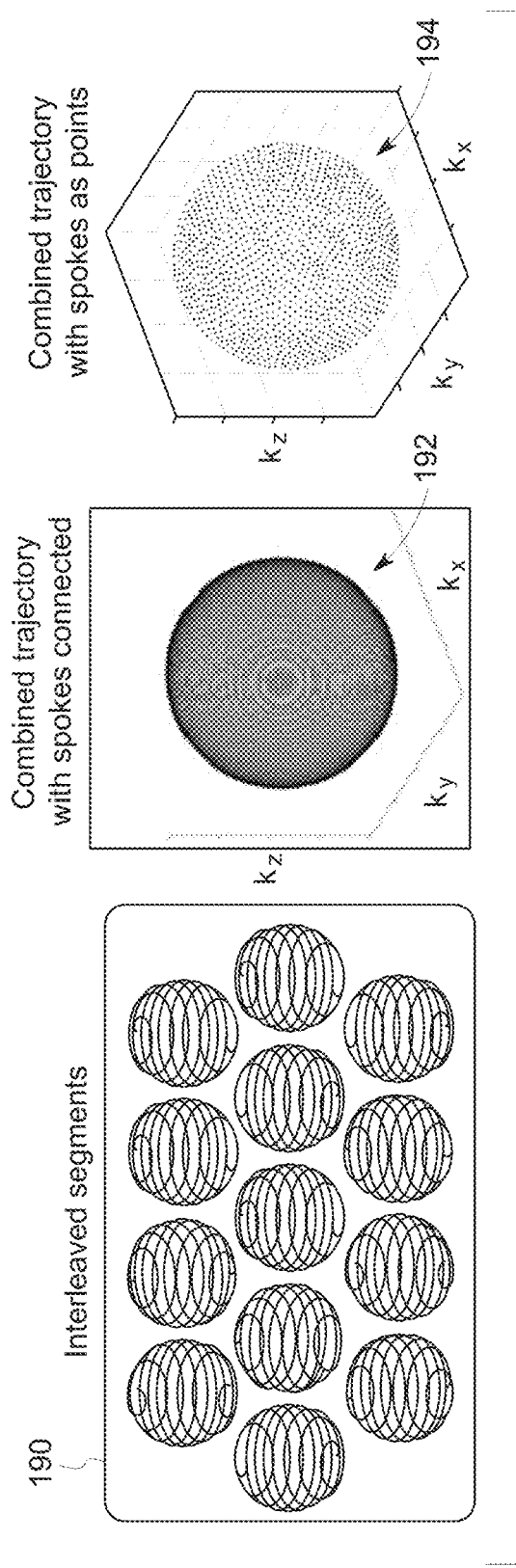
FIG. 4 illustrates an embodiment of interleaved and their combined trajectories (e.g., with spokes connected and spokes as points) using a 3D phyllotaxis formulation.

However, sampling the k-space data with an interleaved 3D radial sampling pattern (e.g., having a phyllotaxis-type trajectory or AZTEK-type trajectory) enables obtaining a plurality of interleaved k-space segments. FIG. 4 illustrates an interleaved trajectory with thirteen interleaves 190 using a 3D phyllotaxis formulation. Each interleaved segment 190 spirals from an end point at a top portion of the segment 190 to an end point at a bottom portion of the segment 190. The number of interleaved k-space segments (e.g., interleaved trajectories) or passes through k-space may vary. In FIG. 4, a combined trajectory 192 of the interleaved segments 190 is illustrated with each spoke connected by a line in the order they were acquired. A combined trajectory 194 of the interleave segments 190 with each spoke shown as a dot is also illustrated. As depicted in FIG. 4, equivalent sampling density (depicted by trajectories 192, 194) to the standard ZTE trajectories 186, 188 (which consist of a single pass through k-space) in FIG. 3 may be obtained with an interleaved phyllotaxis trajectory where the k-space is filled through multiple passes in k-space.

The method 180 includes reconstructing each interleaved segment of the plurality of segments to generate a respective motion (e.g., intrinsic motion) navigator volume or image (e.g., volumetric navigator image) (block 196). The method 180 also includes co-registering (e.g., image-based registration, k-space based registration, or a combination thereof) each respective motion navigator volume or image to estimate motion (block 198) (e.g., by decomposing a rigid motion into a rotational motion and a translational motion). While one may obtain a motion free image using k-space or images based registration, in certain embodiments, other techniques such as global optimization processes can also be used. Rotational motion may be estimated by identifying a rotation of each motion navigator volume or image in k-space magnitude data. Translational motion may also be estimated by identifying a translation of each motion navigator volume or identifying a phase ramp in the k-space data. Alternatively, learning-based methods, such as machine learning or deep learning, can be used for 3D motion extraction of the intended region of interest. In certain embodiments, rigid (e.g., translations, rotations, or a combination thereof) and/or affine transformation may be utilized for co-registration. In certain embodiments each respective motion navigator volume may be co-registered to the other motion navigator volumes. In certain embodiments, each respective motion navigator volume may be co-registered to a static reference state. For example, the static reference state may be a previous volume or image of the region of interest (e.g., from a previous scan, or a previous examination). Another example of the static reference state may be an initial state of the region of interest during the 3D radial pulse sequence. A further example of the static reference state may be a state of the region of interest is at most of the time during the 3D radial pulse sequence.

The method 180 further includes performing motion correction on the raw data (i.e., the k-space data and the plurality of interleaved segments) (block 200). In other words, motion correction is performed on the associated k-space data for each interleaved segment and the respective sampling trajectory for the segment. Motion correction includes correcting for both intra-scan motion and inter-scan motion. In certain embodiments, motion correction includes rotating a k-space trajectory by the rotation identified in step 198 and applying the phase ramp (e.g., identified in step 198) to the k-space data for each motion navigator volume or image.

The method 180 even further includes generating a motion-corrected volume or image (block 202). The motion-corrected image or volume is generated by combining and reconstructing the motion-corrected raw data (i.e., all of the motion-corrected k-space data and associated motion corrected interleaved k-space trajectories). In this process, segments with unreliable motion information, or extreme motion states (e.g. motion beyond a certain limit potentially including non-rigid motion components) can optionally be excluded.

Figure 5:
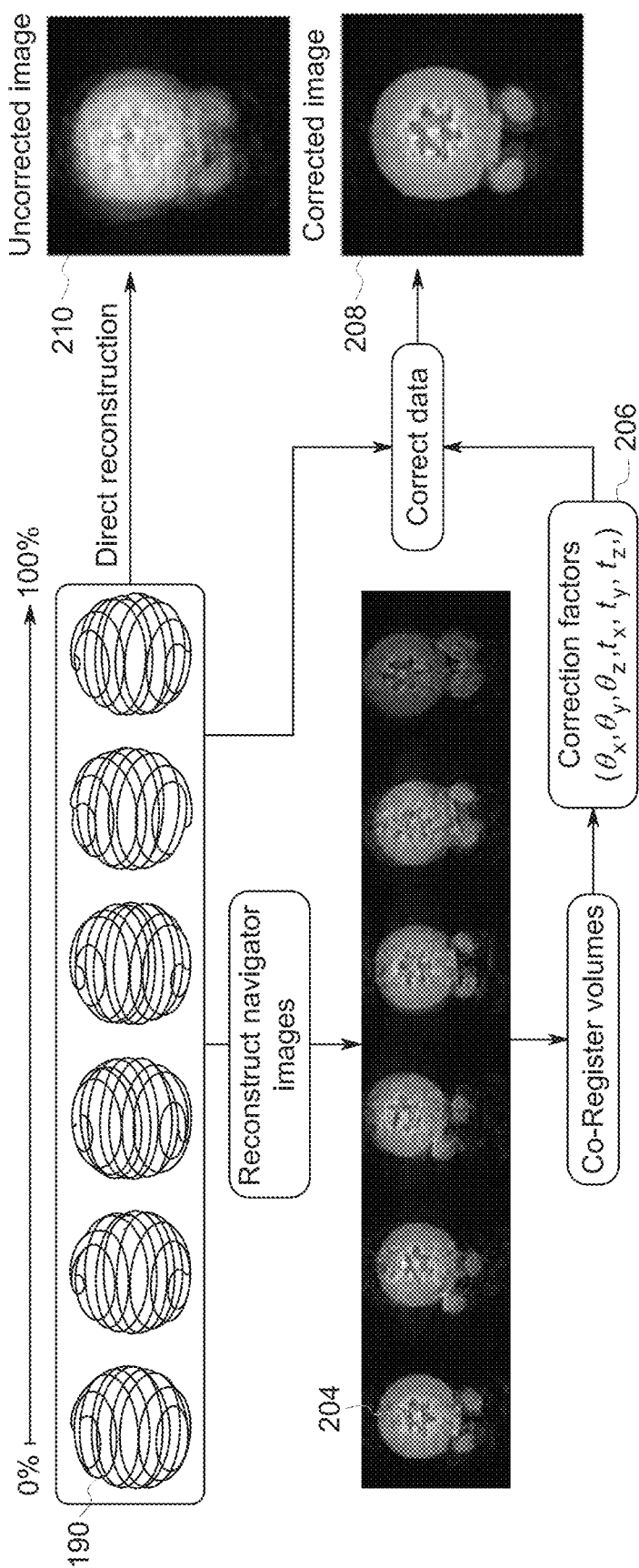
FIG. 5 is a schematic flow diagram of the method of FIG. 2 exemplified with a real data acquisition using a phantom setup.
Figure 6:
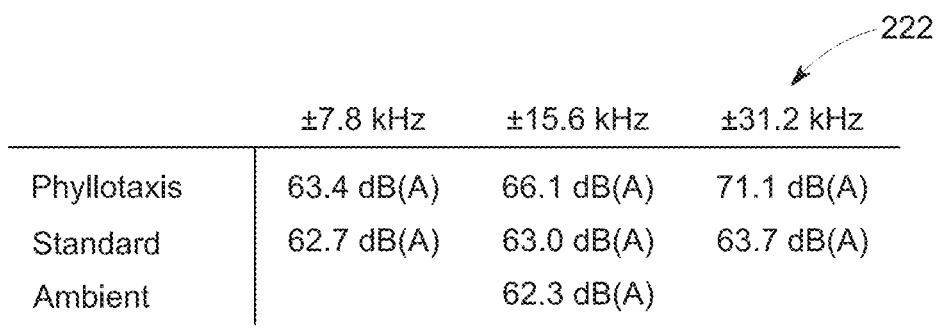
FIG. 6 tabulates example acoustic noise measurements for phyllotaxis and standard trajectories at different imaging bandwidth relative to ambient noise level.

FIG. 5 is a schematic flow diagram of the method 180 of FIG. 2, with example data acquired on a 3T MR scanner using a custom-built phantom which was manually rotated and moved within the scanner to simulate motion. As depicted in FIG. 4, the interleaved k-space segments 190 obtained from sampling the k-space data are reconstructed into respective motion navigator volumes or images 204. Co-registration of the navigator volumes or images 204 results in respective correction factors 206 (e.g., for intra-scan motion and inter-scan motion correction) for each navigator volume or image 204 and associated interleaved k-space trajectories 190. Application of the correction factors to the raw data and k-space trajectories and combination of the data as described above results in the generation of a motion-corrected image or volume 208 (e.g., motion free image) of the region of interest (e.g., brain) which may be compared to an uncorrected image or volume 210 derived from the same combined interleaved k-space segments 190.

The acoustic noise profile from a 3D interleaved trajectory is slightly different from a standard trajectory since obtaining the interleaved structures utilizes multiple passes through k-space. However, the increase in acoustic noise can be limited to well below thresholds required for hearing protection as demonstrated in table 222 in FIG. 7. FIG. 7 depicts the measurements of acoustic noise in a 3T MM scanner from a calibrated MR safe microphone placed in the center of the bore, comparing a phyllotaxis trajectory with 21 interleaved segments to a standard trajectory. The measured background (ambient) noise level was 62.3 dB (A).

The MRI acquisition was performed using following parameters: a matrix size of 192×192×192, a field of view of 192×192×192 mm$^3$, a flip angle of 1 degree, a factor of $\pi$ undersampling relative to the Nyquist criterion, and three different readout bandwidths of ±7.8 kHz, ±15.6 kHz, and ±31.2 kHz. As depicted in FIG. 10, the acoustic noise levels increase with bandwidth as the repetition time gets shorter and the gradients update more frequently. A bigger increase in acoustic noise was observed with the 3D phyllotaxis trajectory compared to the standard trajectory. However, the noise level was still very low. Further acoustic noise reduction can be achieved by distributing the directional gradient update in between spokes over longer periods, or along the individual spokes resulting in slightly bended (as opposed to straight) spokes.

Technical effects of the disclosed embodiments include providing for a system and a method that enable three-dimensional (3D) motion insensitive and quiet magnetic resonance imaging (MM). For example, processing circuitry may be configured for generating motion-corrected medical images by obtaining k-space data of a region of interest (e.g., brain) acquired by an MM system utilizing a 3D radial pulse sequence (e.g., a RUFIS type ZTE pulse sequence) including optional magnetization preparation pulses. The processing circuitry may also be configured for sampling the k-space data to obtain a plurality of interleaved segments (e.g., utilizing an interleaved phyllotaxis-type 3D radial sampling pattern). The processing circuitry may also be configured for decomposing and reconstructing each interleaved segment of the plurality of segments to generate a respective motion navigator volume (e.g., intrinsic motion navigator volume). The processing circuitry may also be configured for co-registering each respective motion navigator volume to estimate motion and performing motion correction (e.g. for both intra-scan and inter-scan motion) on the k-space data and the plurality of interleaved segments. The processing circuitry may also be configured for generating, via the processor, a motion-corrected volume from all of the motion corrected k-space data and the motion-corrected interleaved segments. Optionally segments with unreliable motion information or extreme motion conditions can be excluded. This technique may minimize redundancy in data collection. In addition, this technique may improve patient comfort during a scan and recover data that otherwise may be lost due to motion, which may reduce costs (e.g., by reducing the number of scans needed). Further, the technique may enable those patients that are in the greatest need of assessment (e.g., those that are very unwell or the least compliant) to be scanned.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for generating motion-corrected medical images, comprising:

obtaining, via a processor, k-space data of a region of interest acquired by a magnetic resonance imaging system utilizing three-dimensional (3D) radial pulse sequence with zero echo time (ZTE) acquisition including optional magnetization preparation pulses;

sampling, via the processor, the k-space data to obtain a plurality of interleaved k-space segments;

reconstructing, via the processor, one or more interleaved k-space segments of the plurality of interleaved k-space segments to generate a respective motion navigator volume;

co-registering, via the processor, each respective motion navigator volume to estimate motion;

performing, via the processor, motion correction on the one or more interleaved k-space segments and their corresponding k-space trajectories; and generating, via the processor, a motion-corrected volume from all of the motion corrected interleaved k-space segments and their corresponding motion corrected k-space trajectories.

2. The method of claim 1, wherein the 3D radial pulse sequence comprises the rotating ultra-fast imaging sequence (RUFIS), point-wise encoding time reduction with radial acquisition (PETRA), gradient-modulated ZTE, water- and fat-suppressed proton projection magnetic resonance imaging (WASPI) or hybrid filling of the dead-time gap (HYFI).

3. The method of claim 1, wherein each interleaved k-space segment of the plurality of interleaved k-space segments comprises a phyllotaxis-type trajectory or a AZTEK-type trajectory.

4. The method of claim 1, wherein co-registering each respective motion navigator volume comprises utilizing a rigid or affine transformation.

5. The method of claim 4, comprising extracting rigid or affine motion parameters using machine learning or deep learning.

6. The method of claim 4, wherein co-registering each respective motion navigator volume comprises co-registering each respective motion navigator volume to the other motion navigator volumes.

7. The method of claim 4, wherein co-registering each respective motion navigator volume comprises co-registering each respective motion navigator volume to a static reference state.

8. The method of claim 7, wherein the static reference state comprises a previous volume of the region of interest.

9. The method of claim 7, wherein the static reference state comprises an initial state of the region of interest during the 3D radial pulse sequence.

10. The method of claim 7, wherein the static reference state comprises a state the region of interest is at most of the time during the 3D radial pulse sequence.

11. The method of claim 1, wherein performing motion correction on the k-space data and the plurality of interleaved segments comprises correcting for both intra-scan motion and inter-scan motion.

12. The method of claim 1, wherein co-registering each respective motion navigator volume to estimate motion comprises decomposing a rigid motion into a rotational motion and a translational motion.

13. The method of claim 12, wherein co-registering each respective motion navigator volume to estimate motion comprises identifying a rotation of each motion navigator volume as a rotation in image space or k-space.

14. The method of claim 12, wherein co-registering each respective motion navigator volume to estimate motion comprises identifying translation as a translation in image space or phase ramp in k-space.

15. A medical image motion correction system, comprising:
- processing circuitry configured to execute one or more stored routines, wherein the routines, when executed, cause the processing circuitry to:
- obtain, via a processor, k-space data of a region of interest acquired by a magnetic resonance imaging system utilizing a three-dimensional (3D) radial pulse sequence with zero echo time acquisition including optional magnetization preparation pulses;
- sample the k-space data utilizing an interleaved phyllotaxis-type 3D radial sampling pattern to obtain a plurality of interleaved k-space segments;
- reconstruct one or more interleaved k-space segments of the plurality of k-space segments to generate a respective motion navigator volume;
- co-register each respective motion navigator volume to estimate motion;
- perform motion correction on the one or more interleaved k-space segments and their corresponding k-space trajectories; and
- generate a motion-corrected volume from all of the motion corrected interleaved k-space segments and their corresponding motion corrected k-space trajectories.

16. The medical image motion correction system of claim 15, wherein the routines, when executed, further cause the processing circuitry to:
- co-register each respective motion navigator volume to estimate motion by identifying a rotation of each motion navigator volume in k-space magnitude data of the k-space data and identifying a translation as a phase ramp of each motion navigator volume in the k-space data.

17. The medical image motion correction system of claim 16, wherein the routines, when executed, further cause the processing circuitry to:
- perform motion correction on the k-space data and the plurality of interleaved segments by rotating a k-space trajectory by the rotation and applying the phase ramp to the k-space data for each motion navigator volume.

18. A non-transitory computer-readable medium, the computer-readable medium comprising processor-executable code that when executed by a processor, causes the processor to:
- obtain, via a processor, k-space data of a region of interest acquired by a magnetic resonance imaging system utilizing both a three-dimensional (3D) radial pulse sequence and zero echo time acquisition;
- sample the k-space data utilizing an interleaved phyllotaxis-type 3D radial sampling pattern to obtain a plurality of interleaved k-space segments;
- reconstruct one or more interleaved k-space segments of the plurality of k-space segments to generate a respective motion navigator volume;
- co-register each respective motion navigator volume to estimate motion;
- perform motion correction on the one or more interleaved k-space segments and their corresponding k-space trajectories; and
- generate a motion-corrected volume from all of the motion corrected interleaved k-space segments and their corresponding motion corrected k-space trajectories.

19. The non-transitory computer readable storage medium of claim 18, wherein the processor is further caused to co-register each respective motion navigator volume to estimate motion by identifying a rotation of each motion navigator volume in k-space magnitude data of the k-space data and identifying a translation as a phase ramp of each motion navigator volume in the k-space data.

20. The non-transitory computer readable storage medium of claim 19, wherein the processor is further caused to perform motion correction on the k-space data and the plurality of interleaved segments by rotating a k-space trajectory by the rotation and applying the phase ramp to the k-space data for each motion navigator volume.

* * * * *